United States Patent
Sato et al.

(10) Patent No.: US 6,759,964 B2
(45) Date of Patent: Jul. 6, 2004

(54) FAULT DETECTION SYSTEM

(75) Inventors: Yutaka Sato, Hitachi (JP); Masahiro Nagasu, Hitachinaka (JP); Katsumi Ishikawa, Hitachinaka (JP); Ryuichi Saito, Hitachi (JP); Satoru Inarida, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 39 days.

(21) Appl. No.: 10/098,459

(22) Filed: Mar. 18, 2002

(65) Prior Publication Data

US 2003/0076232 A1 Apr. 24, 2003

(30) Foreign Application Priority Data

Oct. 22, 2001 (JP) ........................................ 2001-323829

(51) Int. Cl.[7] ........................ G08B 17/02; G08B 17/06; H02H 3/24; H02H 5/04
(52) U.S. Cl. ........................ 340/590; 340/598; 361/92; 361/94; 361/103
(58) Field of Search ................................ 340/590, 598, 340/584, 589; 257/177, 178, 226, 293, 712, 717, 723, 724; 361/92, 94, 100, 103

(56) References Cited

U.S. PATENT DOCUMENTS

| 4,970,497 A | * | 11/1990 | Broadwater et al. | ........ 340/598 |
| 5,638,246 A | * | 6/1997 | Sakamoto et al. | .......... 361/103 |
| 5,721,455 A | * | 2/1998 | Takashita | .................... 257/713 |
| 5,912,794 A | * | 6/1999 | Ichikawa | .................... 361/92 |
| 6,288,371 B1 | * | 9/2001 | Hamilton et al. | ........... 219/530 |

FOREIGN PATENT DOCUMENTS

| JP | 7-14948 | 1/1995 |
| JP | 8-126337 | 5/1996 |

* cited by examiner

Primary Examiner—Jeffery Hofsass
Assistant Examiner—Lam Pham
(74) Attorney, Agent, or Firm—McDermott, Will & Emery

(57) ABSTRACT

A fault detection system detecting malfunctions or deteriorations, which may result in an inverter fault, is provided. The system has a temperature sensor installed on a semiconductor module to monitor a temperature rise rate. It is judged that an abnormal condition has occurred if the thermal resistance is increased by the deterioration of a soldering layer of the semiconductor module or by drive circuit malfunctions and, as a result, the relation between an operation mode and the temperature rise rate falls outside a predetermined range.

6 Claims, 14 Drawing Sheets

FAULT DETECTION SYSTEM

BACKGROUND OF THE INVENTION

The present invention relates to a fault detection system that detects a fault or deterioration in a semiconductor module, particularly in an inverter, and to the operation method of an inverter system with a plurality of inverters.

An inverter has been used widely, for example, to save energy in, and increase the functionality of, the power system of a train. One of the important problems of an inverter is to increase the reliability of a semiconductor module in the main circuit. A conventional way to ensure reliability is to make a fatigue test to evaluate performance in order to prevent the semiconductor module from being destroyed during system operation. However, the life of a semiconductor module depends largely on the usage condition and varies widely according to the semiconductor modules. Those problems sometimes result in the sudden destruction of a semiconductor module during system operation and stop the system.

One of main fault modes of a semiconductor module is a semiconductor chip destruction caused by an insufficient radiation. This is caused by a long-time thermal fatigue that generates cracks in the soldering layer attaching the semiconductor chip onto the radiation fin, and those cracks sometimes result in the semiconductor chip being improperly attached. Similar problems have arisen in the semiconductor module of an integrated circuit, such as a CPU, where processing power is significantly increased and the heat generation is a problem.

To solve those problems, JP-A-7-14948 proposes deterioration detection means for detecting a temperature rise in the members of a semiconductor module and, from the change with time, detects deteriorations. JP-A-8-126337 proposes a life estimation method that, with a temperature sensor on a semiconductor module, adds up the thermal stresses actually added to a semiconductor module and, from the resulting value, estimates the life.

The method described in JP-A-7-14948 requires a plurality of temperature sensors, making the detection means in an inverter, composed of a plurality of semiconductor modules, more costly and complicated.

Although the method described in JP-A-8-126337 shows the history of temperatures that caused cracks in the soldering layer, it does not show the degree of deterioration. Another problem is that, because the deterioration of semiconductor modules varies widely, a semiconductor module is sometimes destroyed before the thermal stress reaches the upper limit value. Conversely, a semiconductor module sometimes does not deteriorate at all even when the thermal stress reaches the upper limit. In the latter case, replacing the semiconductor module when the estimated life terminates does not exploit the full capabilities of the semiconductor module.

SUMMARY OF THE INVENTION

It is an object of the present invention to provide a simply structured, low-cost fault detection system capable of directly detecting the deterioration of a semiconductor module without using many detection means.

According to one aspect of the present invention, there is provided a fault detection system that detects a temperature increase rate when a loss is generated using a temperature sensor installed on a semiconductor module and, when the relation between the loss and the temperature rise rate falls out of a predetermined range, judges that a deterioration or a fault has occurred in the semiconductor module.

More specifically, the semiconductor-module fault detection system according to the aspect described above comprises a semiconductor module; a temperature sense device installed on the semiconductor module; temperature measuring means for reading a temperature from the temperature sense device; and fault detecting means for detecting a deterioration or a fault of the semiconductor module based on the temperature measured by the temperature measuring means and an operation command issued to the semiconductor module.

According to another aspect of the present invention, there is provided a semiconductor-module fault detection system comprising a semiconductor module; a temperature sense device installed on the semiconductor module; temperature measuring means for reading a temperature from the temperature sense device; temperature rise rate detecting means for calculating a temperature rise rate from the temperature measured by the temperature measuring means; loss calculating means for calculating a loss generated in the semiconductor module; and fault detecting means for detecting a deterioration or a fault of the semiconductor module based on the temperature rise rate and the loss.

According to the other aspect of the present invention described above, the semiconductor-module fault detection system judges that an abnormal condition has occurred if the temperature rise rate as compared with the loss is larger or smaller than a predetermined range.

According to a still another aspect of the present invention, there is provided a semiconductor-module fault detection system comprising a semiconductor module; a temperature sense device installed on the semiconductor module; temperature measuring means or reading a temperature from the temperature sense device; loss calculating means for calculating a loss generated in the semiconductor module; temperature estimating means for estimating a temperature of the semiconductor module from the loss; and fault detecting means for detecting a deterioration or a fault of the semiconductor modules based on the estimated temperature and the measured temperature.

The semiconductor-module fault detection system described above judges that an abnormal condition has occurred if an absolute value of a difference between the estimated temperature and the measured temperature as compared with the loss is larger than a predetermined range.

The semiconductor-module fault detection system described above has the temperature sense device installed on a cooling fin of the semiconductor module.

According to a still another aspect of the present invention, there is provided an inverter system with a plurality of inverters, a processor that controls the inverters, and an information transmission line over which the inverters and the processor are connected, wherein each of the inverters has the fault detection system described above and the processor changes a command value issued to each inverter according to deteriorations or a faults in the semiconductor module of the inverter.

Other objects, features and advantages of the invention will become apparent from the following description of the embodiments of the invention taken in conjunction with the accompanying drawings.

DETAILED DESCRIPTION OF THE EMBODIMENTS

Figure 2:
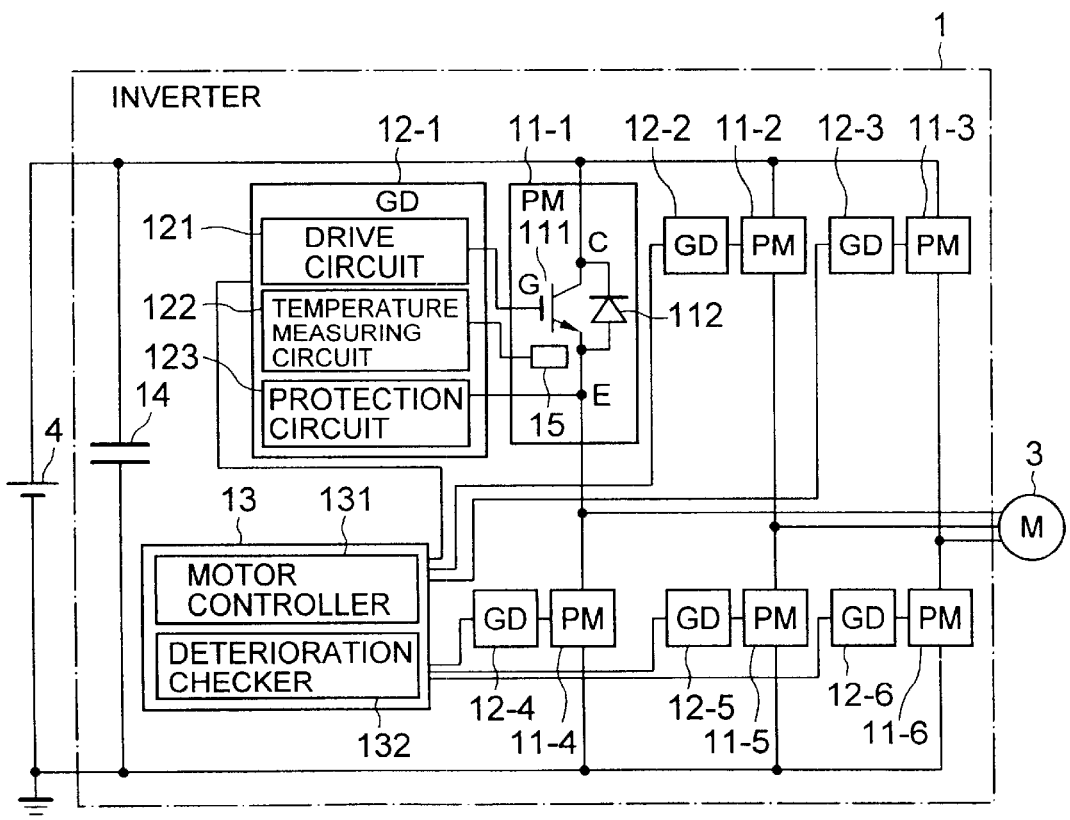
FIG. 2 is a block diagram showing the configuration of the inverter in the first embodiment of the present invention.

Referring to FIG. 2, the configuration of a first embodiment of a fault detection system of semiconductor modules according to the present invention that is applied to an inverter will be described. An inverter 1 in this embodiment comprises six semiconductor modules 11-1–11-6 each of which is a power module (PM), gate drive circuits (GD) 12-1–12-6, a control circuit 13, and a capacitor 14. This inverter transforms the power of a DC power supply 4 into a three-phase AC power to drive a motor 3.

The semiconductor module 11 comprises an insulated-gate bipolar transistor (IGBT) 111 and a diode 112, where C is the collector terminal, E is the emitter terminal, and G is the gate terminal. A temperature sense device 15 is attached to the semiconductor module 11. Although the detailed configuration of the semiconductor modules 11-2–11-6 is omitted, those modules have the same configuration as that of the semiconductor module 11-1.

The gate drive circuit (GD) 12 comprises a drive circuit 121 that drives the IGBT 111 of the semiconductor module 11, a temperature measuring circuit 122, and a protection circuit 123. Although the detailed configuration of the gate drive circuits 12-2–12-6 is omitted, those circuits have the same configuration as that of the gate drive circuit 12-1.

The drive circuit 121 is a circuit that controls the voltage of the gate terminal G of the IGBT 111 to turn on or off the IGBT 111. The temperature measuring circuit 122 is a circuit that measures the temperature using the signal of the temperature sense device 15. The protection circuit 123 is a circuit that turns off the IGBT 111 to protect it when an excess current, an overheating condition, or a drop in the control voltage occurs in the IGBT 111.

The control circuit 13, which comprises a motor controller 131 and a deterioration checker 132, is a circuit that controls the gate drive circuits 12 to control the speed and the drive torque of the motor 3.

The motor controller 131 is a circuit that sends a timing signal, which turns on or off the IGBT 111, to the gate drive circuit 12 so that the motor will operate properly. As will be described in detail below, the deterioration checker 132 is a circuit that diagnoses the deterioration or fault of the semiconductor module 11 based on the measured temperature and a drive command issued to the IGBT 111.

The capacitor 14 keeps constant the DC voltage of the received DC power supply 4.

Figure 3:
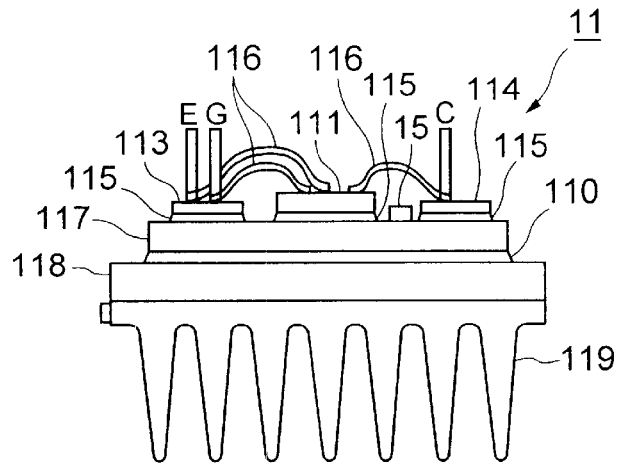
FIG. 3 is a structure diagram showing the configuration of a semiconductor module in the first embodiment of the present invention.

Referring to FIG. 3, the configuration of the semiconductor module 11 will be described. The semiconductor module 11 is configured by attaching the semiconductor chip (IGBT) 111 to an insulating plate 117 with a soldering layer 115 and by attaching the insulating plate 117 to a metal plate 118, which is in contact with a cooling fin 119, via a soldering layer 110.

The semiconductor chip 111 is connected to the emitter electrode E and the gate electrode G via wires 116 and an electrode plate 113 that is connected to the insulating plate 117 via the soldering layer 115, and to the collector electrode C via the wire 116 and an electrode plate 114 that is connected to the insulating plate 117 via the soldering layer 115.

The temperature sense device 15 is installed near the semiconductor chip 111 on the insulating plate 117. In this embodiment, a thermistor whose resistance varies according to the temperature is used as the temperature sense device 15. However, the temperature sense device 15 may be any device other than a thermistor whose measurable characteristic varies according to the temperature. A thermocouple is an example of such a device.

Figure 4:
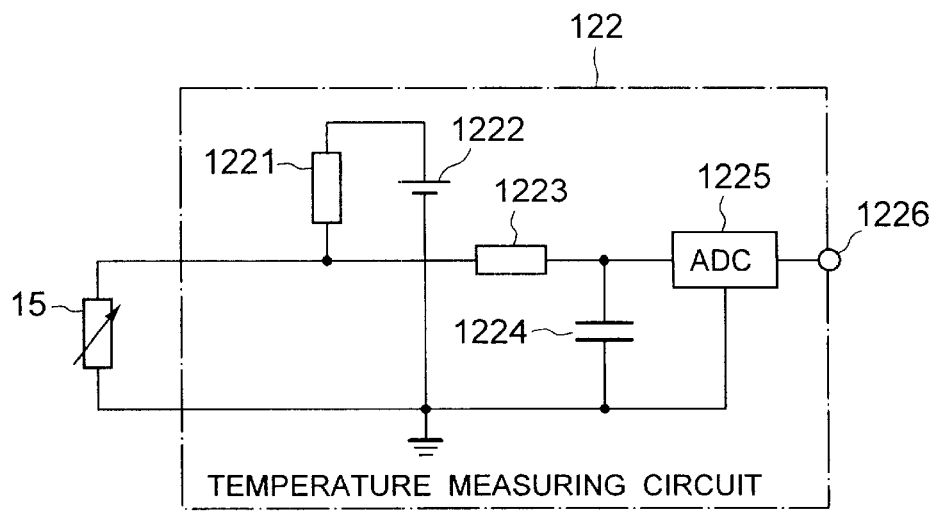
FIG. 4 is a diagram showing the configuration of a temperature measuring circuit in the first embodiment of the present invention.

Referring to FIG. 4, the configuration of the temperature measuring circuit 122 using the thermistor 15 will be described. The temperature measuring circuit 122 comprises a resistor 1221, a voltage source 1222, a resistor 1223, a capacitor 1224, an AD converter 1225, and an output terminal 1226.

The voltage source 1222, the resistor 1221, and the thermistor 15 (as a temperature sensor) are connected in series. When the resistance of the thermistor 15 changes as the temperature changes, the voltage of the connection point between the resistor 1221 and the thermistor 15 changes to indicate that the temperature has changed. The resistor 1223 and the capacitor 1224 form a CR filter acting as a circuit that eliminates noises superimposed on the voltage signal. The AD converter 1225 converts the voltage signal from analog to digital. In this embodiment, the temperature measuring circuit 122 except the thermistor 15 is provided in the gate drive circuit 12.

Of course, the temperature measuring circuit 122 and a converter, which converts a temperature change to the temperature signal, may be provided in some other place. In this embodiment, the temperature measuring circuit 122 is provided in the gate drive circuit 12 because the gate drive circuit is near the semiconductor module 11 and the required power supply is already available. The digitized voltage signal detected by this circuit is sent to the control circuit 13 for use in deterioration checking.

Figure 5:
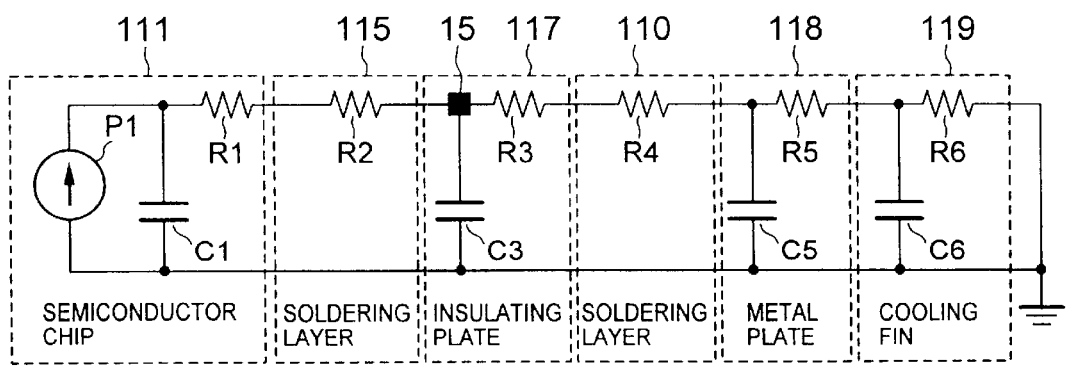
FIG. 5 is a thermal equivalent circuit diagram of the semiconductor module in the first embodiment of the present invention.

Referring to FIG. 5, the thermal equivalent circuit of the semiconductor module 11 will be described. The heat generated by the semiconductor chip 111 may be simulated by current source P1. The thermal resistances of the members are replaced by electric resistors R1–R6, and the thermal capacities by capacitors C1–C6. The thermal capacities of the soldering layers 110 and 115 are so small as compared with those of other members that they are ignored. The temperature of each member corresponds to the voltage at that point. The heat generated in the semiconductor chip 111 is transmitted to the soldering layer 115, insulating plate 117, soldering layer 110, metal plate 118, and cooling fin 119 in this order.

Figure 6:
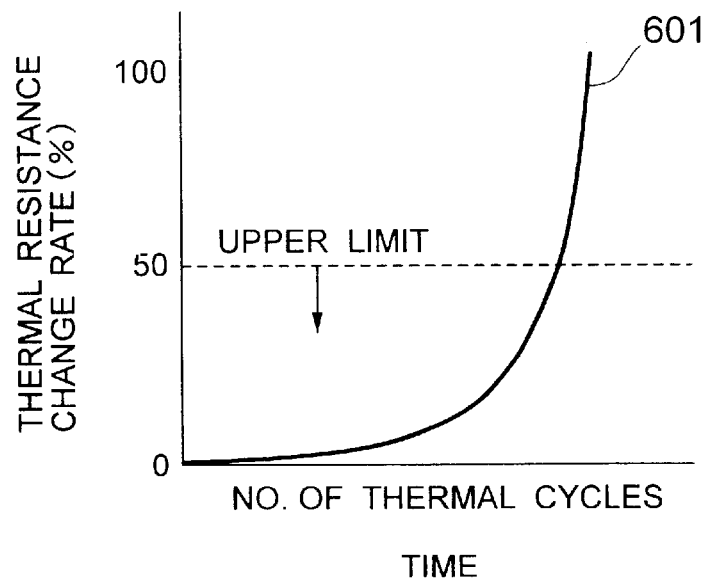
FIG. 6 is a characteristic diagram showing the thermal cycle dependence of a thermal resistance change rate in the first embodiment of the present invention.

Referring to FIG. 6, the dependence of thermal resistance change rate on the number of thermal cycles will be described. This graph shows the result of the thermal cycle test of the semiconductor module, with the thermal resistance change rate in percentage as the vertical axis and the number of thermal cycles in time as the horizontal axis. When the semiconductor chip 111 is heated, a thermal stress is produced by a difference in the thermal expansions among the members. A long use of the semiconductor module 11 gradually causes a crack in the soldering layers 110 and 115 because of this thermal stress and increases the thermal resistance. A crack, once generated, increases the thermal stress and affects the radiation efficiency, producing a greater thermal stress and increasing the number of cracks in the soldering layers. Therefore, as shown by a curve 601 in FIG. 6, the thermal resistance of the semiconductor module 11 increases slowly in the beginning and then increases with accelerating speed. A further increase in the thermal resistance increases the temperature of the semiconductor chip, preventing the semiconductor chip from giving the required electrical characteristic and sometimes destroying the semiconductor chip. The upper limit of the increase rate of the thermal resistance of the semiconductor module in this embodiment is 50% with the required electrical characteristic taken into consideration. This upper limit may be obtained experimentally at a point where the curve in FIG. 6 rises sharply.

Figure 7:
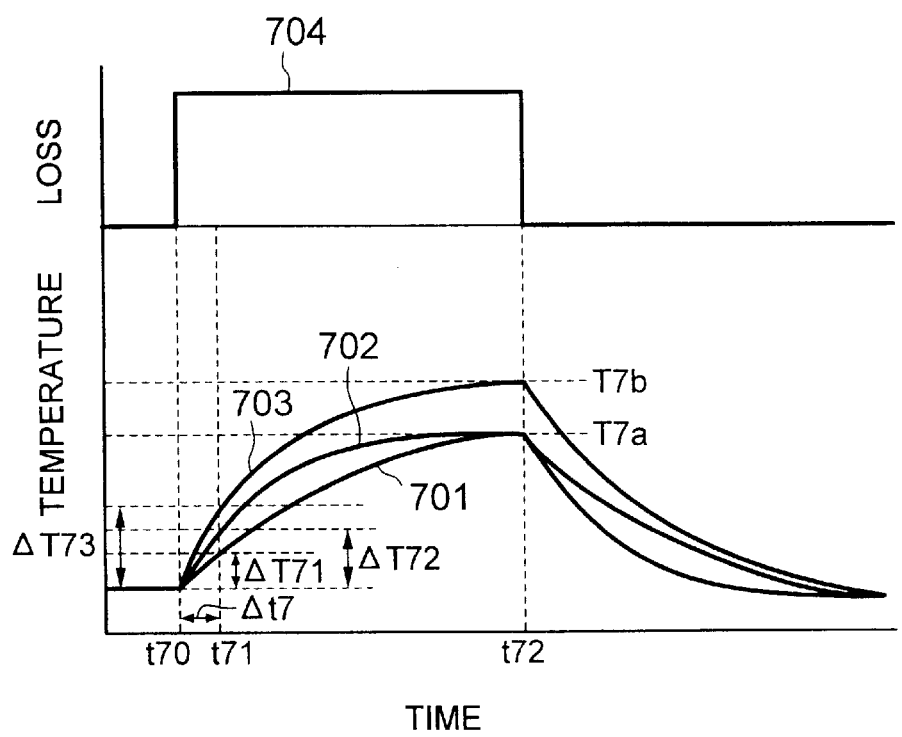
FIG. 7 is a characteristic waveform diagram showing how the loss and the temperature change with time in the first embodiment of the present invention.

Referring to FIG. 7, with a predetermined loss (P1) 704 in the semiconductor module 11, the relation between a temperature detected by the temperature sense device 15 and the loss will be described. The vertical axis indicates the loss and the temperature, and the horizontal axis indicates the time. A curve 702 indicates the change in the normal-time temperature. When the loss P1 is generated at normal time, the temperature gradually rises to a predetermined value T7$a$ and, when the loss is removed, the temperature gradually decreases to the original value.

A curve 701 indicates the change in temperature when the soldering layer 115 has deteriorated and the resistance R2 becomes large. When the resistance R2 is large, it takes time for the heat of the semiconductor chip 111 to be conducted to the temperature sense device 15 and, therefore, the curve 701 rises more slowly than the normal-time curve 702. The temperature T7$a$ in the steady state is equal to the normal-time temperature. This is because the temperature is calculated as product of the sum of resistances R3, R4, R5, and R6 and the generated loss P1.

A curve 703 indicates the change in temperature when the soldering layer 110 has deteriorated and the resistance R4 becomes large. In this case, it becomes difficult for the heat to conduct from the temperature sense device 15 to the cooling fin 119 and, therefore, the curve 703 rises more sharply than the normal-time curve 702. The temperature T7$b$ in the steady state is higher than T7$a$.

Also, if the amount of heat generation (loss) P1 of the semiconductor chip 111 is smaller than the expected value for some reason, the temperature changes as indicated by the curve 701; if the amount of heat generation is larger, the temperature changes as indicated by the curve 703. The loss is increased, for example, when the IGBT is turned on by a malfunction although a turn-off command is issued or when the control voltage drop increases the IGBT on-voltage and increase the loss. Conversely, the loss is decreased, for example, when the semiconductor chip is turned off by a malfunction although the turn-on command is issued.

Therefore, a deterioration or a malfunction may be detected by examining the temperature rise rate $\Delta T/\Delta t$ from the time t70 at which the loss occurs. A low temperature rise rate indicates that the soldering layer on the semiconductor chip side with respect to the temperature sense device 15 has deteriorated or the loss is smaller than the expected value. Conversely, a high temperature rise rate indicates that the soldering layer on the cooling fin side with respect to the temperature sense device 15 has deteriorated or the loss is larger than the expected value.

Figure 1:
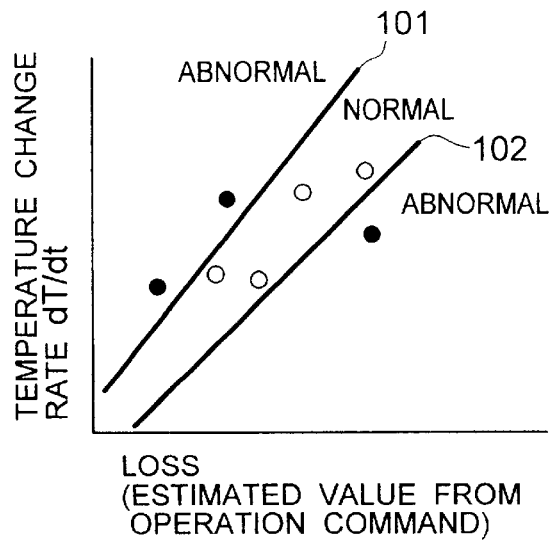
FIG. 1 is a diagram showing the relation between the loss and the temperature change rate of an inverter in a first embodiment of the present invention.
Figure 9:
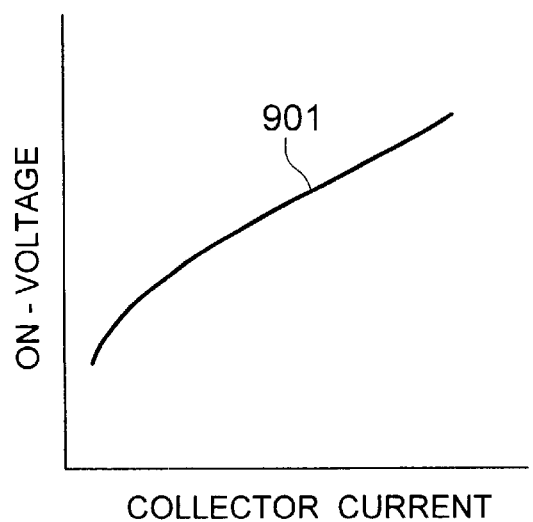
FIG. 9 is a characteristic diagram showing the relation between the collector current and the on-voltage in the first embodiment of the present invention.
Figure 10:
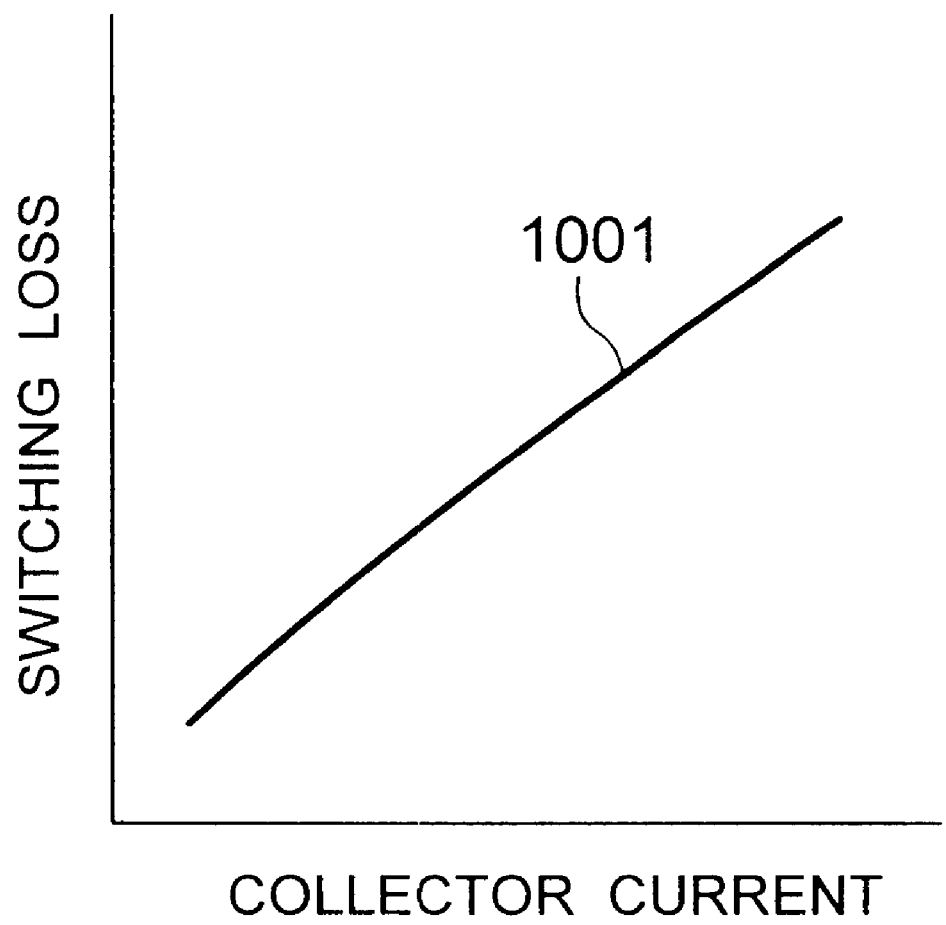
FIG. 10 is a characteristic diagram showing the collector current dependence of a switching loss in the first embodiment of the present invention.

Referring to FIG. 1, the graph used for deterioration detection will be described. The horizontal axis indicates a loss estimated from the operation command, and the vertical axis indicates the temperature rise rate. The major losses of the semiconductor module 11 include an on loss, a switching loss, and an off loss. FIG. 9 shows a curve 901 as an example of the relation between the collector current and the on-voltage of an IGBT. The loss of the IGBT at a turn-on time is calculated by multiplying the collector current by the on-voltage in this graph. FIG. 10 shows a curve 1001 as an example of the dependence of the switching loss on the collector current. This indicates a loss for each switching.

The temperature rise caused by a loss is measured in seconds, while the switching period is measured usually in milliseconds. This means that a loss is calculated, not as an instantaneous value, but as an average during a particular period of time. In this example, the loss in one cycle of the inverter output voltage is calculated. Because the IGBT is repeatedly turned on and off during one cycle period, the losses obtained from FIG. 9 multiplied by the turn-on duration are added up at turn-on time, the loss obtained from FIG. 10 is added for each switching, and finally the result is divided by one-cycle time. Thus, obtaining the collector current, turn-on time, and switching frequency from the command issued to the semiconductor module 11 makes it possible to calculate a loss that will be generated. Of course, a measured value may be used as the collector current value or the actual loss may also be measured.

As described with reference to FIG. 7, when the soldering layer nearer to the heat source than the temperature sense device 15 has deteriorated, the temperature rise rate decreases. Conversely, when the soldering layer far from the heat source has deteriorated or the loss is increased due to some abnormality, the temperature rise rate increases. The upper limit on the thermal resistance shown in FIG. 6 determines the upper limit curve 101 and the lower limit curve 102 of the temperature rise rate in FIG. 1. The semiconductor module is normal if the measured temperature rise rate falls between the two curves, and is abnormal if the measured rise rate is outside those curves. Even if the measured temperature rise rate is in the normal range, the degree of deterioration may be checked according to how near the measured rate is to the upper limit or the lower limit.

As described above, the temperature rise rate varies not only when the soldering layer has deteriorated but also when the loss is different form the expected value. As shown in FIG. 6, the soldering layer gradually deteriorates while the semiconductor module is used, for example, for several years or scores of years. On the other hand, the loss is increased when a fault that occurs in the gate drive circuit 12 of the semiconductor module 11 prevents the semiconductor module from performing an operation instructed by a command value or when the driving circuit voltage drops. Those are caused suddenly by a fault in electronic parts. Therefore, the temperature rises slowly in the former case but sharply in the latter case and so the deterioration. This helps determine the cause of a loss, a deterioration or a fault.

Figure 8:
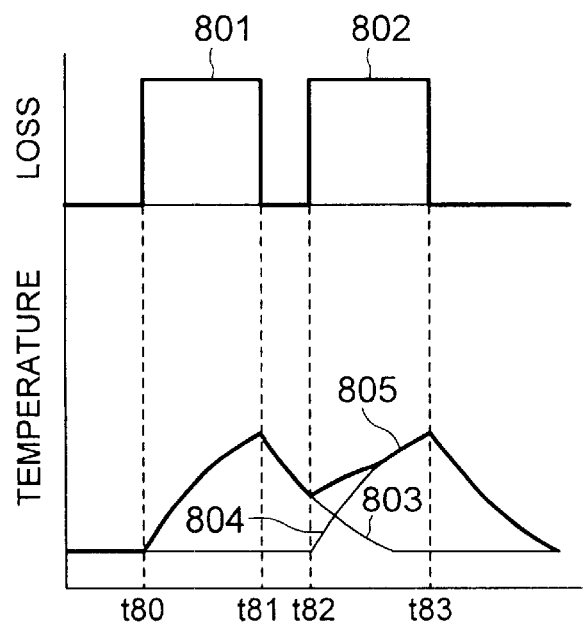
FIG. 8 is a waveform diagram showing how the loss and the temperature change with time in the first embodiment of the present invention.

Referring to FIG. 8, how the temperature rises when losses are generated continuously will be described. A curve 803 indicates how the temperature changes when only a loss 801 is generated, while a curve 804 indicates how the temperature changes when only a loss 802 is generated. When the losses are generated continuously, the temperature actually changes as represented by a curve 805 that is the sum of the curve 803 and the curve 804. This means that, when the temperature rise is measured beginning at time t82, an error is generated by the effect of the previous loss 801. Therefore, to measure the temperature rise rate, it is necessary to start measurement when there is no loss and there is no temperature change, for example, at time t80.

Figure 11:
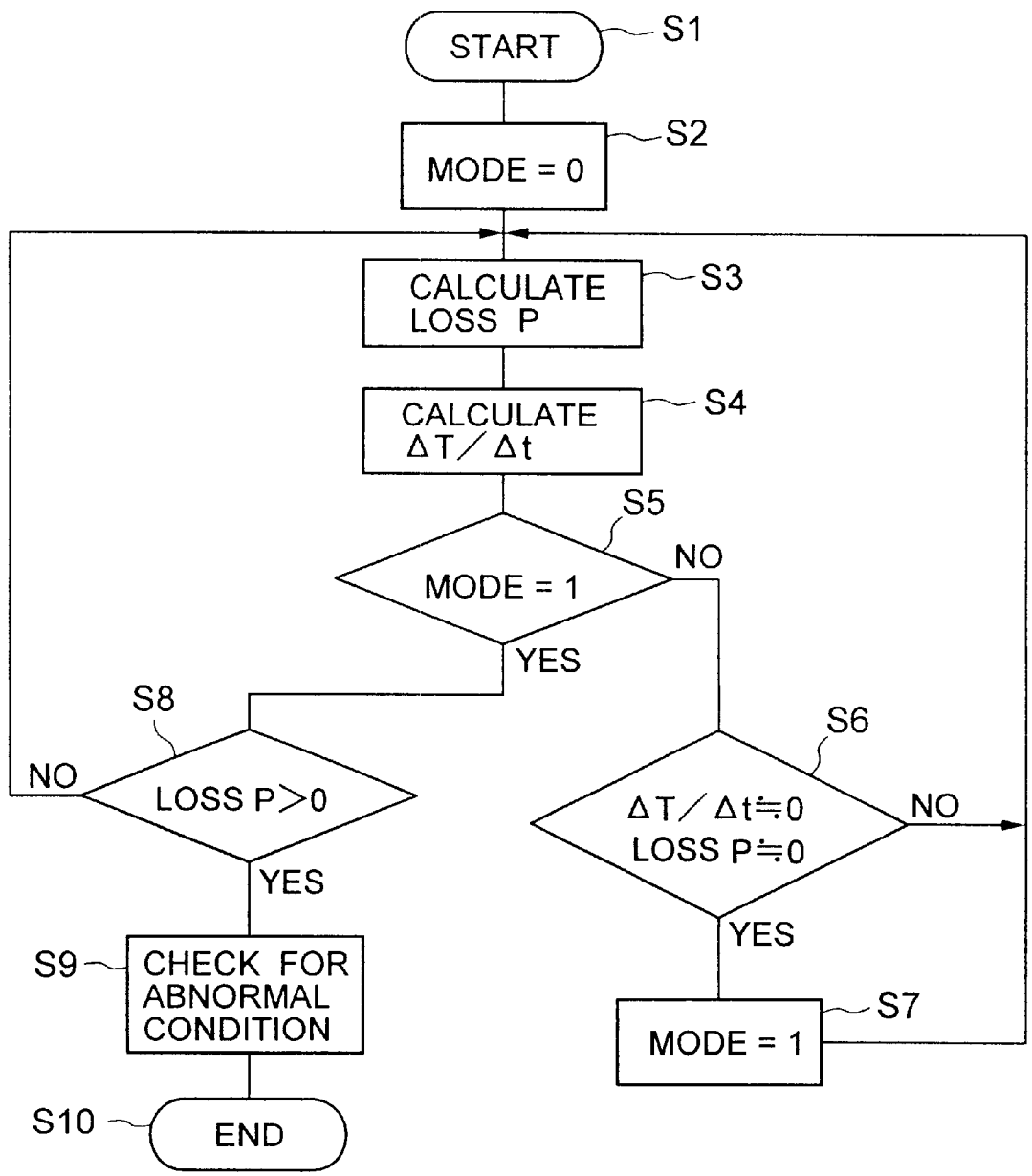
FIG. 11 is a flowchart for checking for an abnormal condition in the first embodiment of the present invention.

With reference to FIG. 11, the procedure for measuring the temperature and checking for an abnormal condition will be described. When the measurement starts (S1), MODE indicating whether or not there is a previous loss effect is set to "0" (S2). In this example, because it is unknown whether there is a previous loss effect when the measurement starts, MODE is set to "0" assuming that there is an effect. Next, the loss is calculated according to the method described above (S3) and then the temperature rise rate (ΔT/Δt) is calculated (S4). Next, a check is made whether MODE is "0" indicating that there is a previous loss or "1" indicating that there is no previous loss (S5). Because MODE is set initially to "0", control is passed to step S6 to check if the loss P is almost 0 and if the temperature rise rate is almost 0(S6). This step is executed to check if there is no effect of a loss that was generated previously. If there is a previous effect (No), control is passed back to step S3. If there is no previous loss effect, MODE is set to "1" (S7) and control is passed back to step S3. After MODE is set to "1", control is passed from step 5 to step S8 to check if there is the loss P (S8). If there is no loss P (P=0), there is no temperature change and then control is passed back to step S3. If there is a loss, a check is made for an abnormal condition by examining, using FIG. 1, that the temperature change rate corresponding to the loss is within the normal range (S9). After that, control is passed back to the start (S1) to start measurement.

As described above, the system according to the present invention makes it possible to detect the deterioration of a soldering layer based on the relation between the temperature rise rate and the loss. This system therefore allows the user to detect deterioration before the semiconductor module is destroyed and to repair and replace the semiconductor module 11, thus increasing system reliability.

Figure 12:
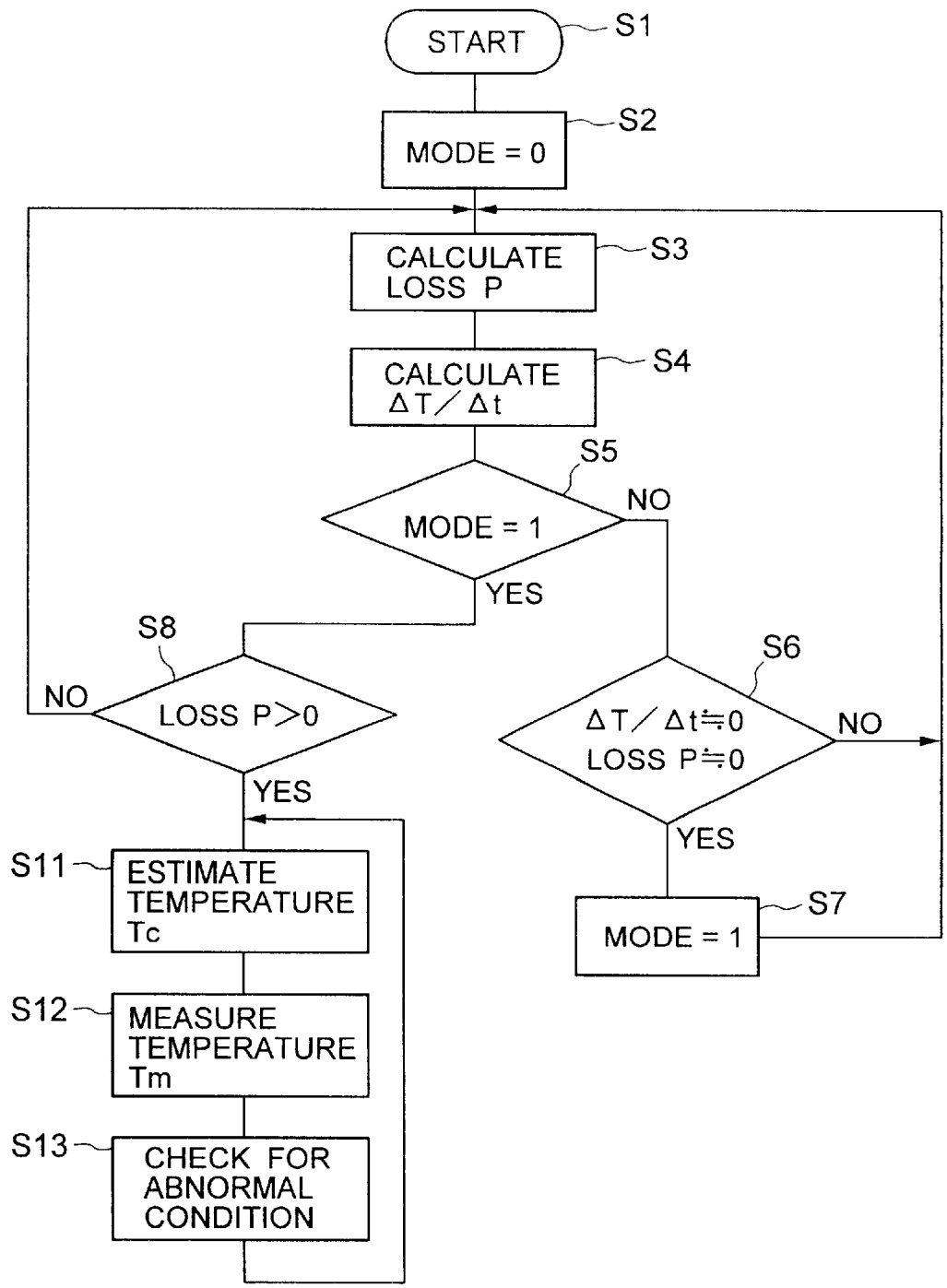
FIG. 12 is a flowchart for checking for an abnormal condition in a second embodiment of the present invention.

With reference to FIG. 12, the overview of fault detection processing in a second embodiment of the fault detection system according to the present invention will be described. A semiconductor module 11 is the same as that in the first embodiment of the first embodiment. Therefore, FIGS. 1–10 may be applied also to this embodiment. Steps S1–S8 in FIG. 12 are also the same as those in FIG. 11. If a loss is generated in step S8 in this embodiment, the temperature Tc of the semiconductor module 11 is estimated using the method that will be described later (S11). Next, the actual temperature Tm is measured by the temperature sense device 15 (S12). Then, the estimated temperature Tc is compared with the actual temperature Tm to check for an abnormal condition (S13). If there is an abnormal condition as described in FIG. 7, the temperature rise rate changes and therefore an abnormal condition may be detected because the temperature after an appropriate period of time Δt is higher or lower than the temperature at the normal time.

After that, control is passed back to step S11 to repeat the estimation, measurement, and checking of the heat. However, because the estimated-temperature error is accumulated after repeating this cycle for a long period of time, control should be passed back to step S1 after some time has passed. This time interval should be set to an interval at which an error will not be accumulated considering the precision of temperature estimation in step S11.

Figure 13:
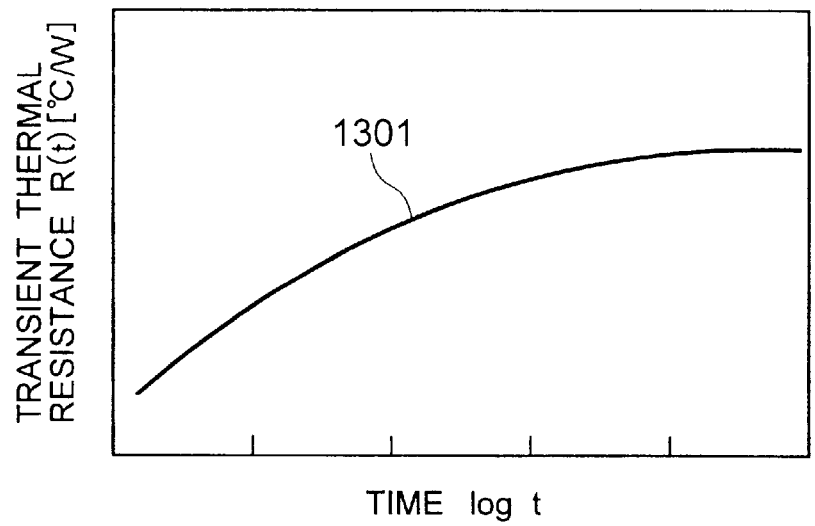
FIG. 13 is a characteristic diagram showing the transient thermal resistance characteristic in the second embodiment of the present invention.
Figure 14:
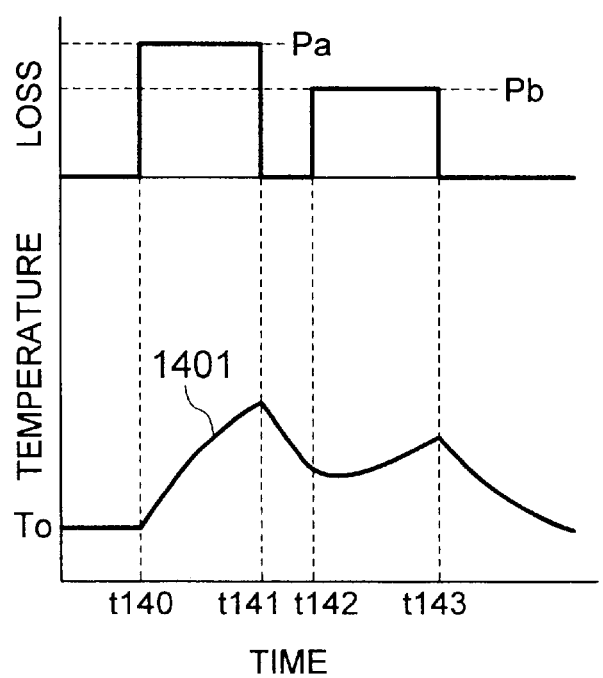
FIG. 14 is a waveform diagram showing how the loss and the temperature change with time in the second embodiment of the present invention.

Next, the temperature estimation method will be described with reference to FIG. 13. FIG. 13 is a graph showing the transient thermal resistance in the temperature sensor installation portion. This graph is created by dividing the measured value of the temperature sensor, which is obtained when a predetermined loss is given, by the loss. FIG. 14 shows a curve 1401 indicating the temperature change when the loss is generated. The temperature at a given point of time may be calculated by the following Expressions (Expression 1–Expression 4) using the transient thermal resistance R(t) in FIG. 13.

$$t140<t<t141 \ldots T=Pa \times R(t-t140)+T_o \quad (1)$$

$$t141<t<t142 \ldots T=-Pa \times R(t-t141)+Pa \times R(t-t140)+T_o \quad (2)$$

$$t142<t<t143 \ldots T=Pb \times R(t-t142)-Pa \times R(t-t141)+Pa \times R(t-t140)+T_o \quad (3)$$

$$t143<t \ldots T=-Pb \times R(t-t143)+Pb \times R(t-t142)-Pa \times R(t-t141)+Pa \times R(t-t140)+T_o \quad (4)$$

where, To is the temperature at time t140.

R(t) becomes constant after enough time has elapsed. Therefore, there is no need to consider a loss generated after enough time has elapsed since the generation of the loss. For example, after enough time has elapsed from tl41, the effect of Pa may be considered 0. This period of time, usually from several seconds to scores of seconds, may be determined by a transient thermal resistance curve 1301. In this way, the temperature may be estimated at any time in this embodiment. This means that, unlike the first embodiment, a deterioration may be detected at any time.

Although the temperature is estimated from the transient thermal resistance in this example, a differential equation may be created from the circuit shown in FIG. 5. By doing so, the temperature may be estimated more precisely.

As described above, the system according to the present invention makes it possible to detect the degree of a deterioration in the soldering layer from the relation between the temperature rise rate and the loss. Therefore, the system allows the user to detect a deterioration before the semiconductor module is destroyed and to repair and replace the semiconductor module, increasing system reliability.

Figure 15:
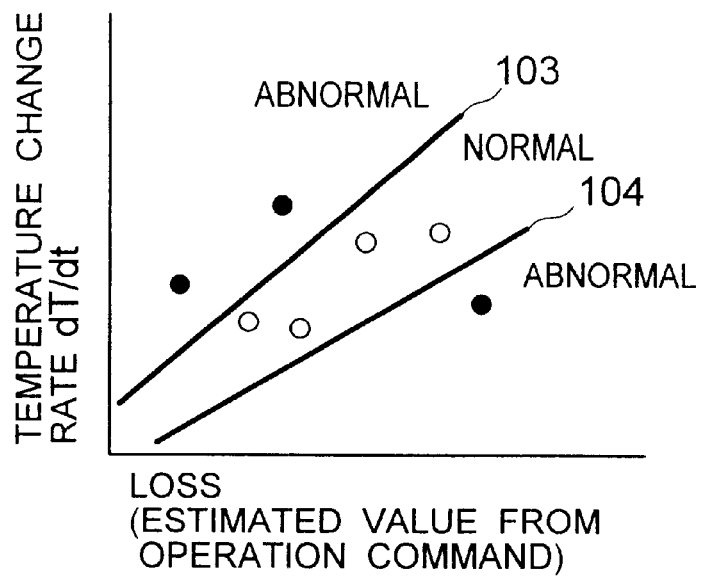
FIG. 15 is a characteristic diagram showing the relation between the loss and the temperature change rate in a third embodiment of the present invention.
Figure 16:
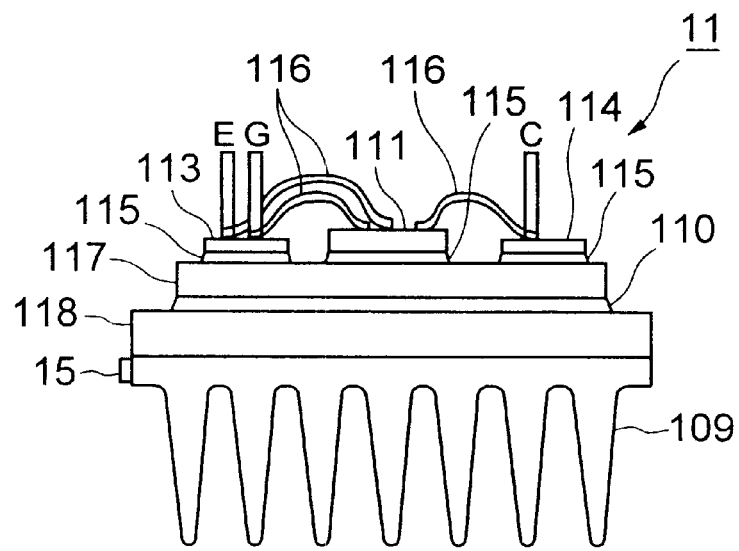
FIG. 16 is a structure diagram showing the configuration of a semiconductor module in the third embodiment of the present invention.
Figure 17:
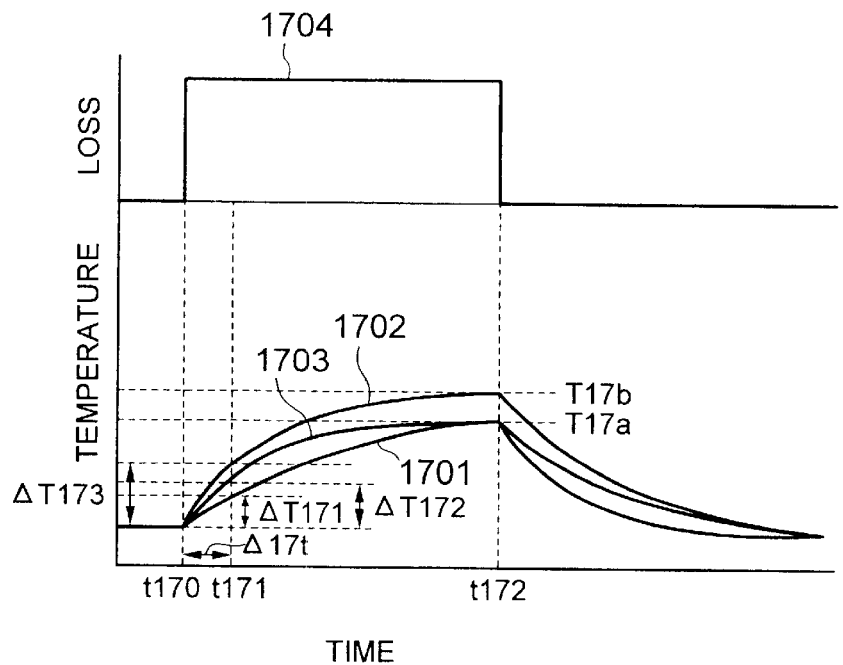
FIG. 17 is a characteristic waveform diagram showing how the loss and the temperature change with time in the third embodiment of the present invention.

With reference to FIGS. 15–17, a fault detection system in a third embodiment of the present invention will be described. FIG. 15 is a graph used for checking for an abnormal condition and used by the fault detection system in the third embodiment of the present invention. FIG. 16 is a diagram showing the configuration of a semiconductor module in the third embodiment. FIG. 17 is a graph showing the temperature rise when a loss is generated. As shown in FIG. 16, the system in the third embodiment differs from the system in the first embodiment shown in FIG. 3 in that a temperature sense device 15 is installed on a cooling fin 119. Except this, the configuration of this embodiment is the same as that of the first embodiment, and FIGS. 2, 4, 6, 9, 10, and 11 may be applied also to this embodiment. The equivalent circuit in FIG. 5 is also the same except the location of the temperature sense device 15.

FIG. 17 shows how the temperature rises when a loss is generated. Unlike that of the embodiment in FIG. 1, the temperature sense device 15 is separated from the semiconductor chip 111 that is the heat source. This makes the temperature change smaller as compared with that in FIG. 7 in the first embodiment. However, the trend is exactly the same, and the same method may be used to detect deterioration. In this case, because the soldering layers that may deteriorate are on the side of the heat source with respect to the temperature sense device 15, the temperature rise rate is low as the deterioration increases. Therefore, a high temperature rise rate always indicates that the loss is increased by an abnormal operation. Of course, the method described in the second embodiment may be used to detect deterioration. The systems in the first and second embodiments require a semiconductor module that contains a temperature sensor. By contrast, the system in this embodiment only requires a temperature sensor to be externally installed on the cooling fin of the semiconductor module that does not contain a temperature sensor. This reduces the system cost.

As described above, the temperature sense device 15 is installed on the insulating plate 117 in the first embodiment, and on the cooling fin 119 in the third embodiment. However, the location of the temperature sense device 15 is not limited to those locations but it may be installed anywhere along the radiation path of the semiconductor chip. For example, the temperature sense device may be installed on the metal plate 118 or on the semiconductor chip 111. Note that, when installing on the semiconductor chip 111, the temperature sense device 15 needs insulation to prevent it from a high voltage. In this case, with a temperature-sensing diode on the semiconductor chip, the temperature may be detected, for example, by the dependence of the on-voltage of this diode on the temperature. The structure is not limited either to that shown in FIG. 3 and FIG. 16. The fault detection system according to the present invention may always be applied as long as there is a heat source and, along the radiation path, there is a substance such as a soldering layer whose thermal resistance is changed by a thermal fatigue. In addition, the fault detection system according to the present invention may be applied to an integrated circuit other than the power semiconductor module described above.

Figure 18:
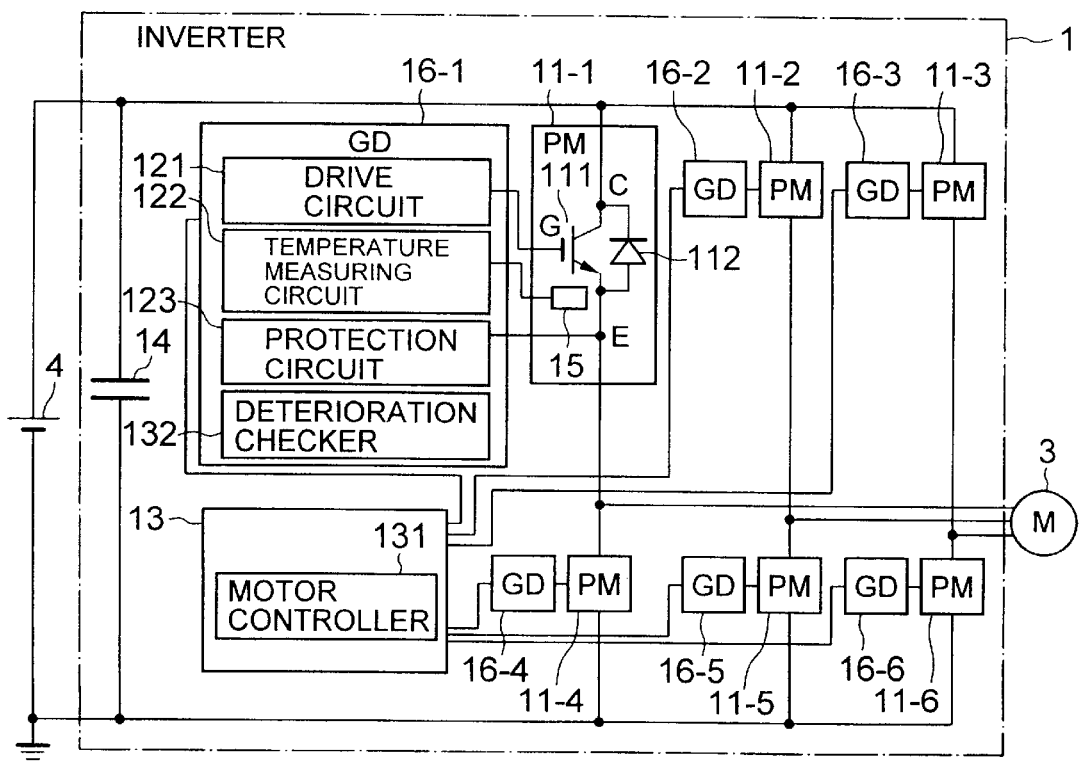
FIG. 18 is a block diagram showing the configuration of an inverter in a fourth embodiment of the present invention.

Referring to FIG. 18, the configuration of an inverter 1 in a fourth embodiment of the present invention will be described. The inverter 1 in the fourth embodiment differs from the inverter in the first embodiment in that the deterioration checker 132 is not in the control circuit 13 but in the gate drive circuit 16. FIG. 1 and FIGS. 3–11 are applied also to this embodiment. The system in the first embodiment, where the control circuit 13 checks the deterioration of six semiconductor modules 11-1–11-6, requires the control circuit 13 to have high processing power. Because motor control also requires relatively high processing power, this embodiment is useful when the hardware performance of the control circuit 13 cannot be increased. In this case, the gate drive circuit 16 requires power higher than that of the gate drive circuit 12 in the first embodiment.

Figure 19:
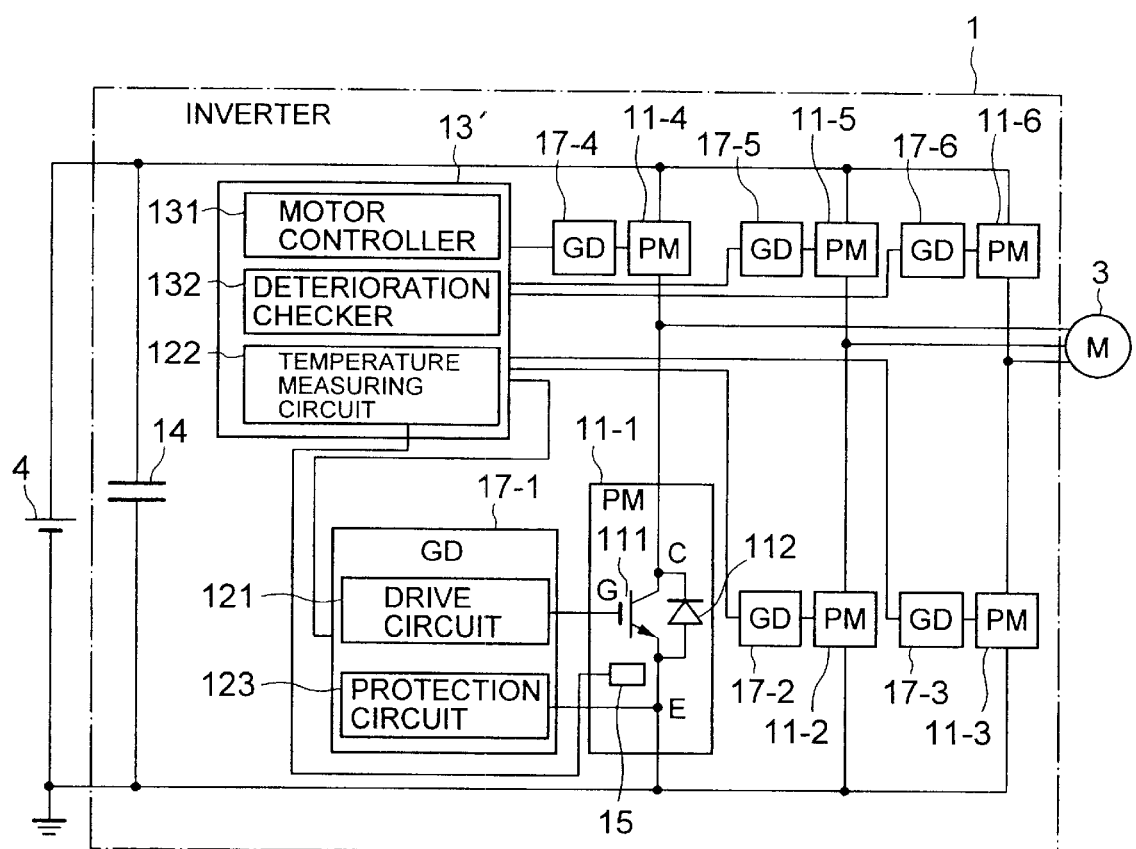
FIG. 19 is a block diagram showing the configuration of an inverter in a fifth embodiment of the present invention.

Referring to FIG. 19, the structure of an inverter 1 in a fifth embodiment of the present invention will be described. The inverter in the fifth embodiment differs from the inverter in the first embodiment in that the temperature sense device 15 is provided only in one semiconductor module 11-1 and the temperature is measured by a control circuit 13' and in that the gate drive circuit is configured as a gate drive circuit 17 comprising the drive circuit 121 and the protection circuit 123. FIG. 1 and FIGS. 3–11 are applied also to this embodiment. The semiconductor modules 11-2–11-6 except the semiconductor module 11-1 each have the configuration similar to that of the semiconductor module 11-1 from which the temperature sense device 15 has been removed. Of course, instead of providing two types of semiconductor module, it is also possible to configure the inverter such that all semiconductor modules have the temperature sense device 15 but that the temperature sense device of only one semiconductor module will be used. The temperature sense device 15 is installed on the bottom of two semiconductor modules connected in series. The reason is that it is difficult to install insulation on the top of a semiconductor module where there is a high voltage but is relatively easy on the bottom.

The temperature measuring circuit 122 and the deterioration checker 132 are included in the control circuit 13'. For example, if the gate drive circuit 17-1 must have the temperature measuring function and the deterioration checking function, it is necessary to provide two types of gate drive circuit: one with those functions and the other without those functions. Another method is to assign those functions to all gate drive circuits 17 and allow only one of the circuits to use the functions. Because those methods are ineffective, those functions are included in the control circuit 13'. Another reason is that the control circuit 13' originally has high processing power for motor control.

In this embodiment, a deterioration check is made only for one of six semiconductor modules 11. The semiconductor modules 11-1–11-6 included in the inverter are affected similarly by the heat while the inverter is used. Therefore, if one of the semiconductor modules is found deteriorated, it is estimated that other semiconductor modules have deteriorated similarly. Another advantage is that the embodiment is simple in structure because the circuits and the processing required for temperature measurement and deterioration checking are about one sixth of those required for the first embodiment. However, because semiconductor modules vary in quality, some semiconductor modules deteriorate sooner and, in some cases, some others may be determined as distructed or down although no deterioration is detected.

Figure 20:
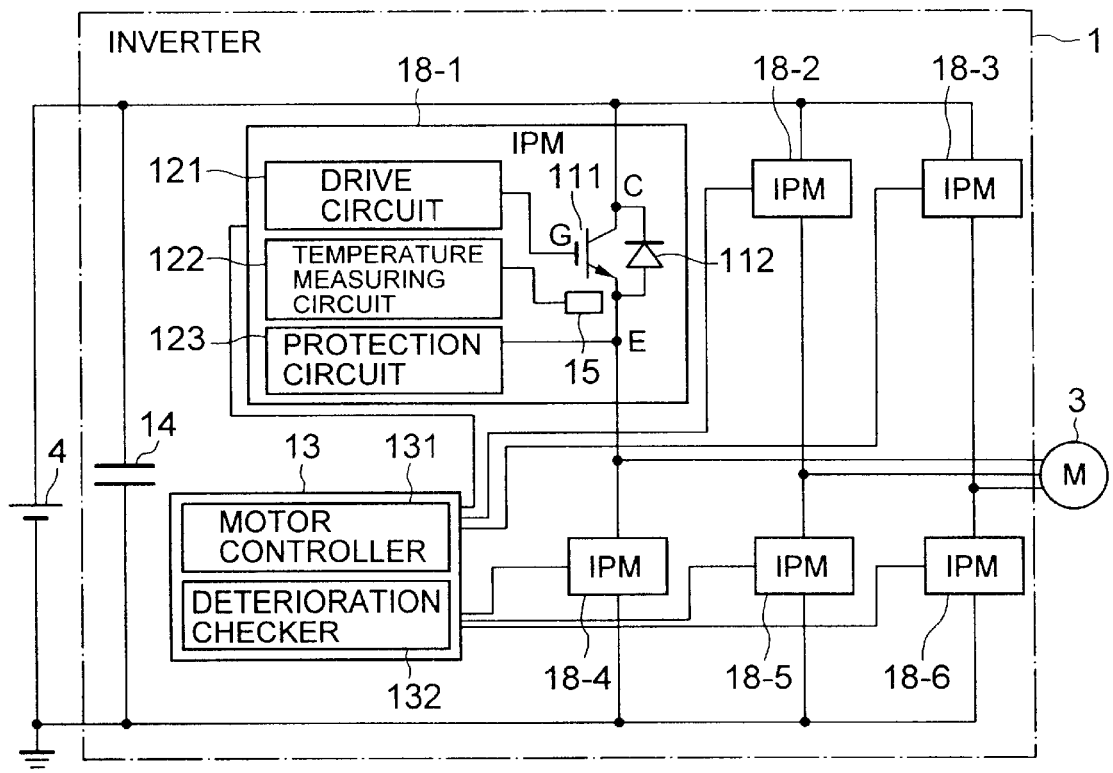
FIG. 20 is a block diagram showing the configuration of an inverter in a sixth embodiment of the present invention.

Referring to FIG. 20, the configuration of an inverter 1 in a sixth embodiment of the present invention will be described. The inverter 1 in the sixth embodiment differs from the inverter 1 in the first embodiment in that a high-functionality semiconductor module (IPM) 18, in which the semiconductor module and the gate drive circuit are integrated, is used. The high-functionality semiconductor module 18 comprises an IGBT 111, a diode 112, a temperature sense device 15, a drive circuit 121, a temperature measuring circuit 122, and a protection circuit 123. Although the detailed configuration of the high-functionality semiconductor modules 18-2–18-6 is omitted, those modules have the same configuration as that of the high-functionality semiconductor module 18-1.

Figure 21:
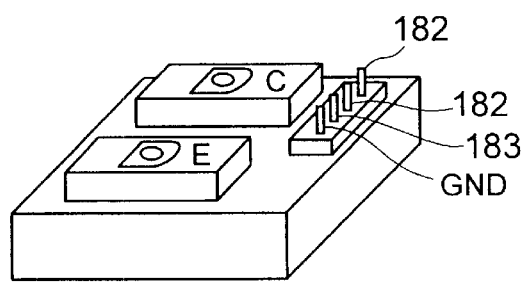
FIG. 21 is an external view showing a semiconductor module in the sixth embodiment of the present invention.

FIG. 21 is an external view of the high-functionality semiconductor module (IPM) 18. The high-functionality semiconductor module 18 has the major terminals, that is, collector C and emitter E, in the center and the control terminals on the terminal board in the corner. The control terminals include four terminals: a drive signal input terminal 181 that receives an on-off command from the control circuit, a state output terminal 182 that outputs temperature information and protection information, a control power input terminal 183, and a ground terminal GND. From the state output terminal 182, the serial signal indicating the internally measured temperatures or the protection circuit operation state is output. The control circuit 13 checks deterioration based on this signal.

Figure 22:
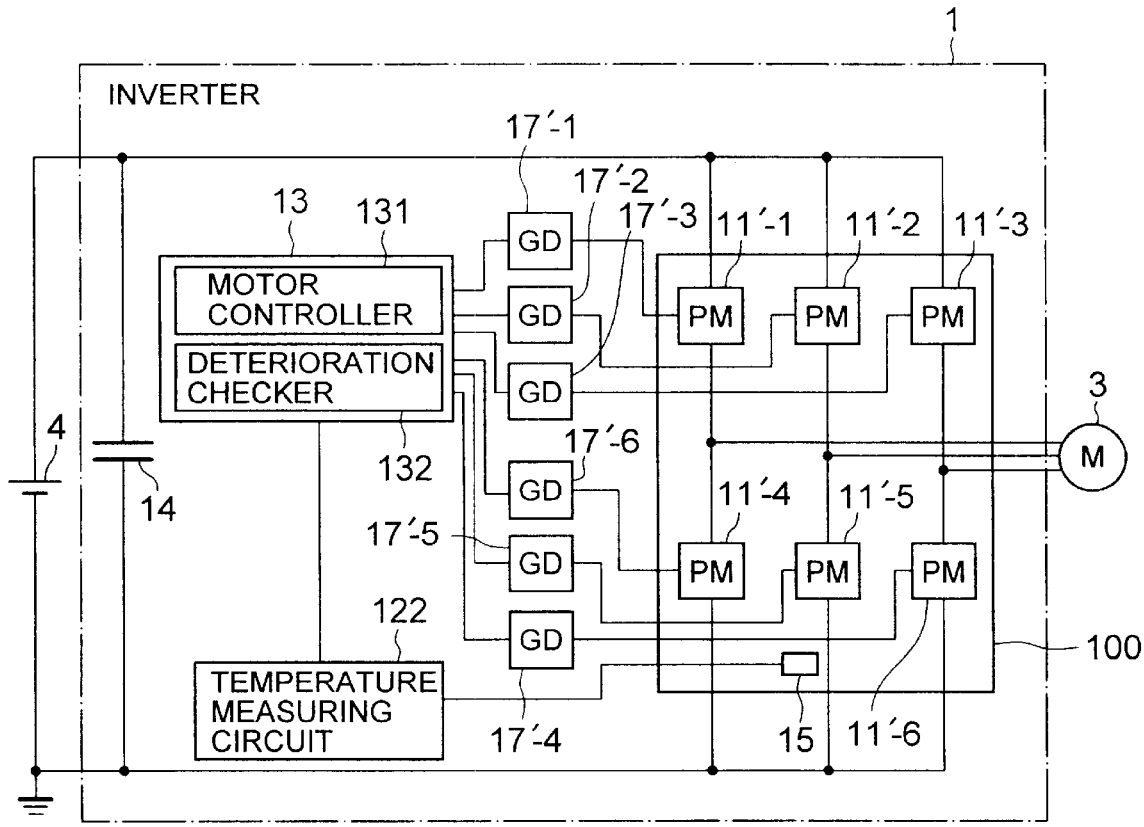
FIG. 22 is a block diagram showing the configuration of an inverter in a seventh embodiment of the present invention.

FIG. 22 shows the configuration of an inverter 1 in a seventh embodiment of the present invention. In each of six semiconductor modules 11'-1–11'-6, only an IGBT and a diode are installed but a temperature sense device 15 is not, and those modules are installed on a cooling unit 100 on which the temperature sense device 15 is installed. In addition, a temperature measuring circuit 122 is independent of a gate drive circuit 17'.

Figure 23:
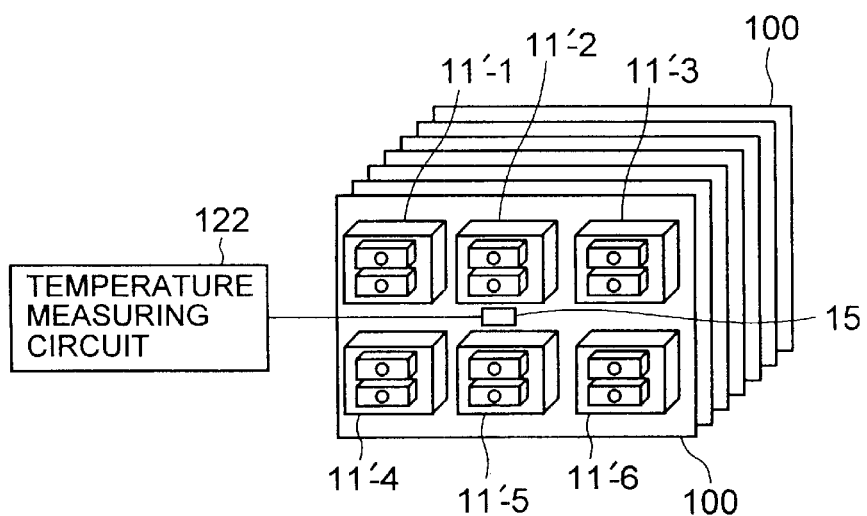
FIG. 23 is an external view showing the inverter in the seventh embodiment of the present invention.

FIG. 23 is an external view of this semiconductor module 11' and the cooling unit 100. The heat generated by the semiconductor modules 11' is radiated into air by the cooling unit 100. The cooling unit 100 has the temperature sense device 15 installed. The temperature measuring circuit 122 measures the temperature using the signal sent from the temperature sense device 15. The control circuit 13 checks deterioration based on this temperature information. It is possible to detect deterioration because, in this embodiment, the temperature rise rate changes if any one of six semiconductor modules 11' deteriorates. Note that, because the temperature rise rate caused by the deterioration of a semiconductor module far from the temperature sense device 15 is lower than that of a semiconductor module near the temperature sense device 15, it is desirable that both the temperature sense device 15 and the temperature measuring circuit 122 be highly precise.

Figure 24:
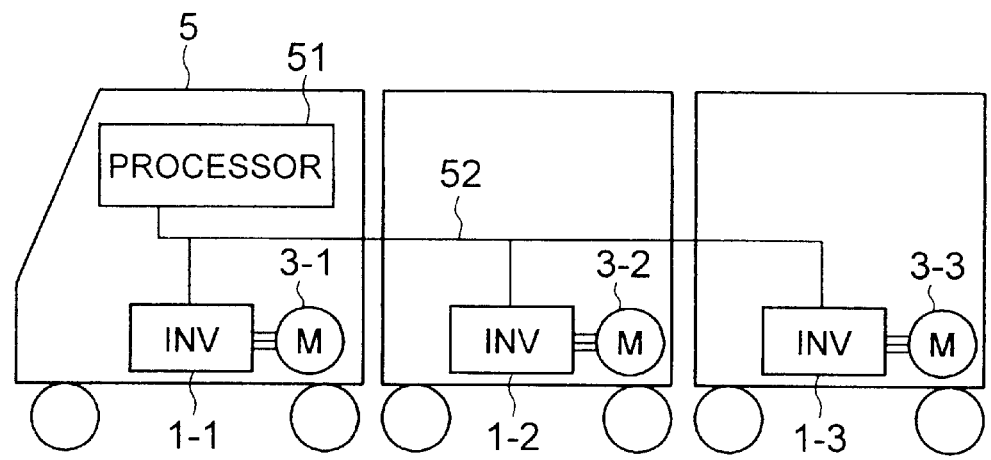
FIG. 24 is a schematic diagram showing the configuration of an inverter system in a vehicle in an eighth embodiment of the present invention.

With reference to FIG. 24, the configuration of an inverter system using the fault detection system described above will be described. This invention is an example in which an inverter with the fault detection system described above is applied to a train 5. A plurality of inverters 1-1–1-3 drive motors 3-1–3-3 to run the train 5. The inverters are one of those described in the first embodiment to the seventh embodiment. All inverters are connected to a processor 51 via a network 52.

Figure 25:
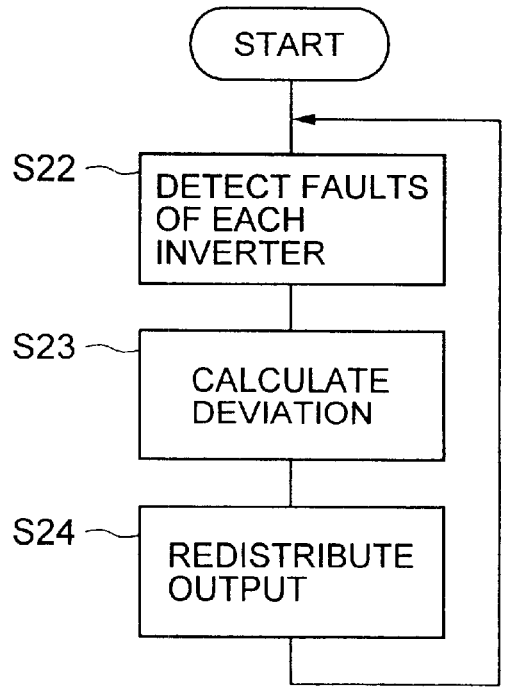
FIG. 25 is a flowchart showing an output adjustment in the eighth embodiment of the present invention.

With reference to FIG. 25, fault detection processing and output redistribution processing executed in the processor 51 will be described. First, the processor uses the method described in the first embodiment to the seventh embodiment to collect, via the network 52, information on faults or deteriorations generated in each inverter (S22). The processor uses the result to calculate the deviation of the deterioration (S23) and, based on the resulting value, redistributes the output of the inverters (S24). The output of a rapidly deteriorated inverter is decreased, while the output of the remaining inverters is increased. This method gives an output required for the operation of the whole system and, at the same time, minimizes the output of the rapidly deteriorated inverter, thus slowing down deterioration. As a result, the system life may be prolonged significantly. It is also possible at this time that an extremely deteriorated inverter or a malfunctioning inverter, if any, is stopped and the remaining inverters are used to run the train.

In this embodiment, each inverter detects deteriorations and faults of the semiconductor module. However, each inverter need not always detect deteriorations or faults. For example, information on the temperature of the semiconductor modules may be transmitted to the processor 51 over the network 52 to allow the processor 51 to check for deteriorations and faults.

As described above, the system according to the present invention may adjust the output of each inverter according to the degree of deterioration. Therefore, the system may slow down the deterioration of a deteriorated inverter and prolongs the system life. In addition, the system may detect the degree of deterioration before a deteriorated inverter becomes inoperable and therefore ensures increased reliability.

As described above with reference to drawings, the system according to the present invention, if used in a unit using semiconductor modules, detects an increase in the amount of loss generated by the malfunctions of the drive circuit or an increase in the thermal resistance caused by cracks in the soldering layer of a power module. This function increases system reliability.

It should be further understood by those skilled in the art that the foregoing description has been made on embodiments of the invention and that various changes and modifications may be made in the invention without departing from the spirit of the invention and the scope of the appended claims.

What is claimed is:

1. A fault detection system comprising:
   a semiconductor module;
   a temperature sense device installed on said semiconductor module;
   temperature measuring means for measuring a temperature from said temperature sense device; and
   fault detecting means coupled to said temperature measuring means for detecting a deterioration or a fault of said semiconductor module, based on the temperature measured by said temperature measuring means and an operation command issued to the semiconductor module.

2. The fault detection system according to claim 1, wherein said temperature sense device is installed on a cooling fin of the semiconductor module.

3. A fault detection system comprising:

a semiconductor module;

temperature sense element built in said semiconductor module;

temperature measuring means for determining a temperature from said temperature sense element;

temperature rise rate detecting means for calculating a temperature rise rate from the temperature measured by said temperature measuring means;

loss calculating means for calculating a loss caused in the semiconductor module; and fault detecting means coupled to said detecting means and said loss calculating means for detecting a degradation or a fault of said semiconductor module, based on the calculated temperature rise rate and the calculated loss.

4. The fault detection system according to claim 3, wherein the system judges that an abnormal condition has occurred if the temperature rise rate as compared with the loss is larger or smaller than a predetermined range.

5. A fault detection system comprising:

a semiconductor module;

a temperature sense device installed on said semiconductor module;

temperature measuring means for reading a temperature from said temperature sense device;

loss calculating means for calculating a loss generated in the semiconductor module;

temperature estimating means for estimating a temperature of the semiconductor module from the loss; and fault detecting means for detecting a deterioration or a fault of said semiconductor modules based on the estimated temperature and the measured temperature.

6. The fault detection system according to claim 5, wherein the system judges that an abnormal condition has occurred if an absolute value of a difference between the estimated temperature and the measured temperature as compared with the loss is larger than a predetermined range.

* * * * *